United States Patent
Ryan

(10) Patent No.: US 8,324,093 B2
(45) Date of Patent: Dec. 4, 2012

(54) METHODS FOR FABRICATING SEMICONDUCTOR DEVICES INCLUDING AZEOTROPIC DRYING PROCESSES

(75) Inventor: E. Todd Ryan, Clifton Park, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 384 days.

(21) Appl. No.: 12/508,417

(22) Filed: Jul. 23, 2009

(65) Prior Publication Data

US 2011/0021028 A1    Jan. 27, 2011

(51) Int. Cl.
*H01L 21/4763* (2006.01)

(52) U.S. Cl. ........ 438/622; 438/637; 438/706; 438/745; 257/E21.581

(58) Field of Classification Search .................. 438/700, 438/706, 723, 745, 619, 622, 637, 638; 257/E21.581
See application file for complete search history.

(56) References Cited

U.S. PATENT DOCUMENTS

| | | | |
|---|---|---|---|
| 4,798,744 A * | 1/1989 | Goldstein et al. | 427/389.9 |
| 2005/0173803 A1* | 8/2005 | Lu et al. | 257/759 |
| 2008/0118995 A1* | 5/2008 | Tamboli et al. | 438/4 |
| 2008/0163893 A1* | 7/2008 | Quillen et al. | 134/2 |
| 2008/0311752 A1* | 12/2008 | Sharma | 438/694 |

* cited by examiner

*Primary Examiner* — Michael Trinh
(74) *Attorney, Agent, or Firm* — Ingrassia Fisher & Lorenz, P.C.

(57) ABSTRACT

Embodiments of a method for fabricating a semiconductor device are provided. In one embodiment, the method includes the steps of providing a partially-completed semiconductor device including a first feature formed in a porous material, wet cleaning the partially-completed semiconductor device with an aqueous cleaning solvent, exposing the partially-completed semiconductor device to a liquid chemical that forms an azeotropic mixture with water, and inducing evaporation of the azeotropic mixture to remove residual water from within the porous material absorbed during the wet cleaning step.

19 Claims, 3 Drawing Sheets

METHODS FOR FABRICATING SEMICONDUCTOR DEVICES INCLUDING AZEOTROPIC DRYING PROCESSES

TECHNICAL FIELD

The present invention relates generally to semiconductor devices and, more particularly, to embodiments of a method for fabricating a semiconductor device wherein residual water is removed from within a porous material utilizing an azeotropic drying process.

BACKGROUND

During fabrication of a semiconductor device, etching processes are utilized to form contact openings (also referred to as "via through-holes" or simply "vias") and other features (e.g., trenches) through an inter layer dielectric ("ILD") to form electrical interconnects. Such etching processes typically leave behind etch residue, which may adhere to the inner sidewalls of a contact opening. Also, in cases wherein an ashing process is performed to remove a patterned photoresist utilized to define the contact openings, the ashing process can generate additional contaminants that lodge within the contact openings and within the ILD. Therefore, to remove etch residue and other contaminants, the semiconductor device is typically subjected to a wet or dry clean process. In the case of a wet clean process, the semiconductor device is flooded with an aqueous cleaning solvent, such as hydrofluoric acid diluted in water. The solvent effectively dissolves and washes away etch residue and other contaminants from within the contact openings and thus helps to ensure that a low resistance contact can be achieved during subsequent fabrication steps.

ILDs are increasingly being formed from ultra low-k ("ULK") materials having relatively high porosities; e.g., porosities exceeding 10% and, in certain cases, approaching 50%. Advantageously, highly porous ULK materials provide superior electrical isolation and thus permit the interconnect capacitance to be minimized. However, when formed from a highly porous ULK material, the ILD tends to absorb a substantial volume of water during post-etch wet clean processes of the type described above. In particular, water from the aqueous cleaning solvent is absorbed through the porous sidewalls of the contact openings and often diffuses a significant distance into the body of the porous ILD. Although some of the absorbed water may evaporate during subsequent fabrication steps (e.g., liner degas), a portion of the absorbed water remains within the porous ILD as residual moisture. As the semiconductor device is subjected to thermal cycling during further processing steps, the residual water reacts with and oxidizes the metal liner subsequently deposited over the sidewalls of the contact openings and trenches. Oxidation decreases the effectiveness of the metal liner as a barrier to the conductive (e.g., copper) plug later formed within the contact opening. In addition, oxidation of the metal liner can also result in an undesirable increase in line-to-line capacitance when the metal liner is formed from a metal (e.g., tantalum) that becomes a high k dielectric upon oxidation. Although the porous ILD can be dehydrated by performing an annealing process wherein the semiconductor device is exposed to elevated temperatures (e.g., 150 to 500 degrees Celsius) for a prolonged period of time prior to metallization, the performance of such a prolonged anneal is time consuming and can result in an undesirable deformation of the ILD proximate the contact openings. The thermal budget of the transistors, already formed, may also limit the temperatures used for interconnection fabrication.

There thus exists an ongoing need to provide embodiments of a method for fabricating a semiconductor device including a drying process that removes residual water and other contaminants from within a highly porous material, such as an inter layer dielectric formed from a porous ultra low-k material, without prolonged exposure of the semiconductor device to high temperatures. Preferably, embodiments of the semiconductor fabrication method would include a drying technique that can be readily incorporated into existing wet cleaning process utilized to remove etch residue and other contaminants from the inner sidewalls of features (e.g., contact openings) formed in an inter layer dielectric. Other desirable features and characteristics of the present invention will become apparent from the subsequent Detailed Description and the appended Claims, taken in conjunction with the accompanying Drawings and this Background.

BRIEF SUMMARY

Embodiments of a method for fabricating a semiconductor device are provided. In one embodiment, the method includes the steps of providing a partially-completed semiconductor device including a first feature formed in a porous material, wet cleaning the partially-completed semiconductor device with an aqueous cleaning solvent, exposing the partially-completed semiconductor device to a liquid chemical that forms an azeotropic mixture with water, and inducing evaporation of the azeotropic mixture to remove residual water from within the porous material absorbed during the wet cleaning step.

BRIEF DESCRIPTION OF THE DRAWINGS

The present invention will hereinafter be described in conjunction with the following drawing figures, wherein like numerals denote like elements, and wherein.

DETAILED DESCRIPTION

The following Detailed Description is merely exemplary in nature and is not intended to limit the invention or the application and uses of the invention. Furthermore, there is no intention to be bound by any expressed or implied theory presented in the preceding Technical Field, Background, Brief Summary, or the following Detailed Description.

Figure 1:
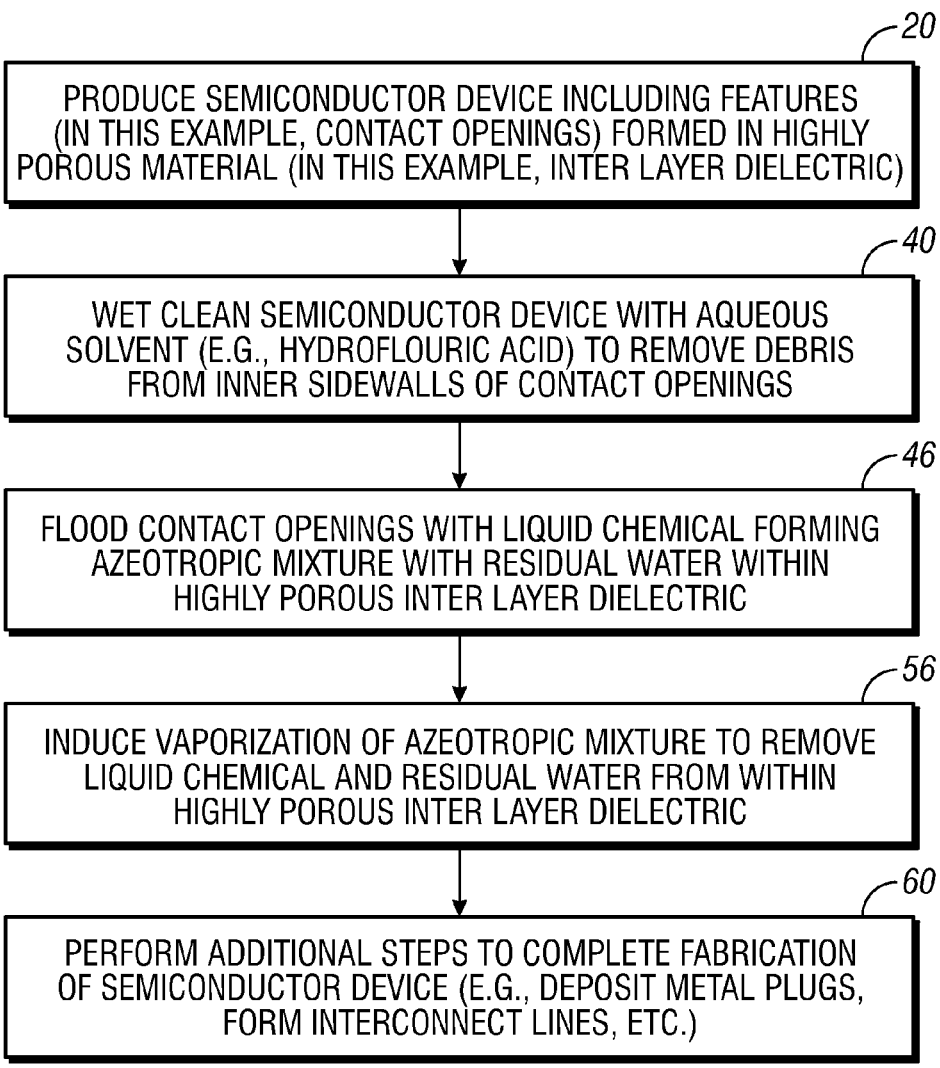
FIG. 1 is a flowchart illustrating a method for fabricating a semiconductor device including an azeotropic drying process that removes residual water and other contaminants from within a porous material (e.g., an inter layer dielectric formed from a highly porous ultra low-k material) in accordance with a first exemplary embodiment.

FIG. 1 is a flowchart illustrating a method for fabricating a semiconductor device including an azeotropic drying process that removes residual water and other contaminants from within a highly porous material in accordance with a first exemplary embodiment. As appearing herein, the term "highly porous" denotes a material having a porosity exceeding approximately 10%. Embodiments of the exemplary semiconductor fabrication method illustrated in FIG. 1 are particularly useful for removing residual water from an inter layer dielectric formed from a highly porous ultra low-k material, such as an organosilicate glass, and will consequently be described below in such a context; however, embodiments of the method can also be utilized to remove residual water and other contaminants (e.g., debris from ashing processes, liquid contaminants resulting from the use of optical planarizing layer solvents, etc.) from other porous materials employed in the fabrication of a semiconductor device, whether or not such materials are "highly porous" as defined herein.

Figure 2:
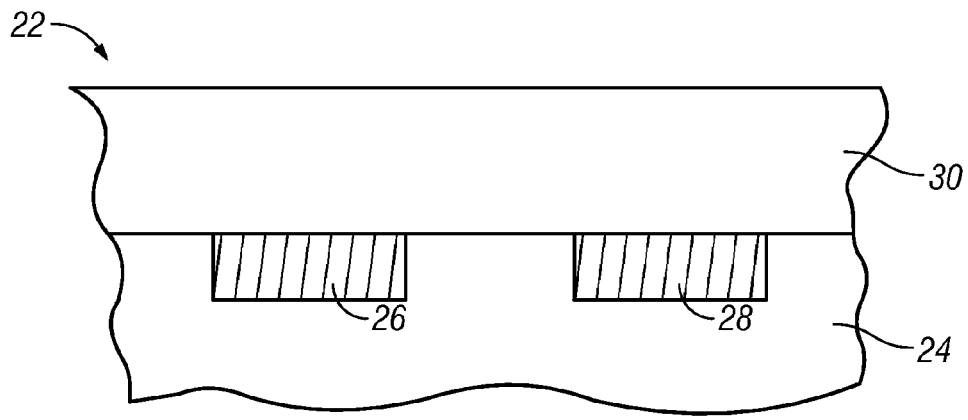
FIGS. 2-8 are simplified cross-sectional views illustrating a portion of an exemplary semiconductor device at various stages of fabrication and produced in accordance with the exemplary method shown in FIG. 1.
Figure 3:
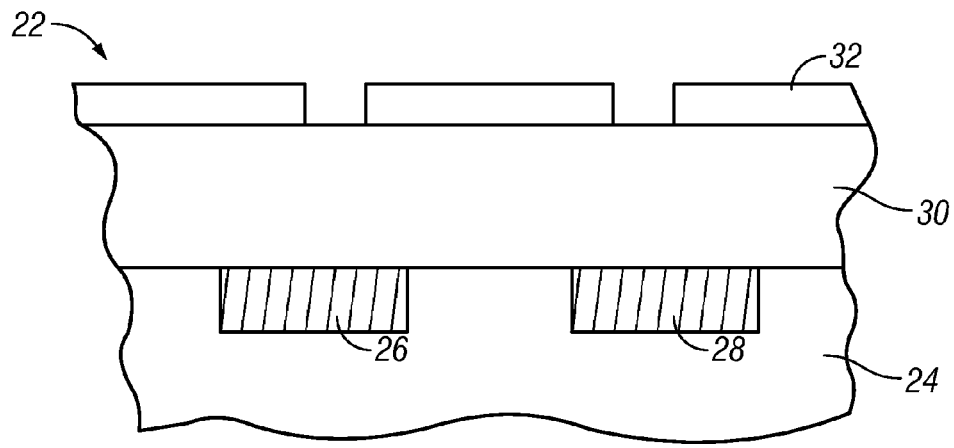
Figure 4:
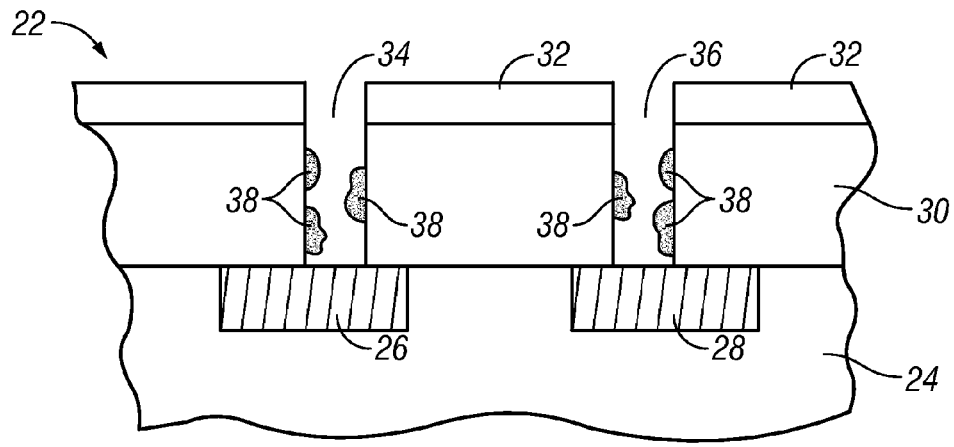

The exemplary fabrication process illustrated in FIG. 1 commences with the production of a partially-fabricated semiconductor device including a plurality of features (e.g., contact openings, trenches, etc.) formed in a highly porous material, such as an inter layer dielectric formed from a highly porous ultra low-k material (STEP 20). FIGS. 2-4 are simplified cross-sectional views illustrating a portion of an exemplary semiconductor device 22 during various stages of fabrication that may be performed during STEP 20 of the exemplary process illustrated in FIG. 1. Referring initially to FIG. 2, partially-completed semiconductor device 22 is formed utilizing a semiconductor substrate 24. Semiconductor substrate 24 is preferably a silicon substrate (the term "silicon substrate" encompassing the relatively pure silicon materials typically used in the semiconductor industry, as well as silicon admixed with other elements, such as germanium and the like). As illustrated in FIG. 2, semiconductor substrate 24 can be a bulk silicon wafer. Alternatively, semiconductor substrate 24 can assume the form of a silicon-on-insulator wherein an upper silicon layer overlies an intermediate silicon layer (commonly referred to as a "buried oxide" or "BOX" layer), which is, in turn, supported by a silicon carrier wafer. In the illustrated example, first and second contact points 26 and 28 are formed within an upper portion of semiconductor substrate 24. Contact points 26 and 28 can be doped regions of semiconductor substrate 24 as illustrated in FIG. 2; however, contact points 26 and 28 may each comprise other electrically-active elements, such as a gate electrode or a conductive interconnecting layer, in alternative embodiments.

An inter layer dielectric ("ILD") 30 is deposited overlying the upper surface of semiconductor substrate 24 and contact points 26 and 28. ILD 30 can be blanket deposited over semiconductor substrate 24 utilizing a chemical vapor deposition technique, such as low pressure chemical vapor deposition (LPCVD) or plasma enhanced chemical vapor deposition (PECVD) technique, performed with a silicon source material, such as tetraethylorthosilicate (TEOS). Alternatively, the insulative material utilized to form ILD 30 can be applied to semiconductor substrate 24 utilizing a spin-on technique. ILD 30 is preferably formed from a highly porous ultra low-k material having a dielectric constant less than approximately 2.5. In one embodiment, the porosity of ILD 30 is increased during deposition of an ultra low-k low-k material is preferably deposited to have a porosity between approximately 10% and approximately 50% and, still more preferably, between approximately 20% and approximately 30%. The average pore diameter of the ultra low-k material deposited to form ILD 30 is preferably less approximately 5 nanometers (nm). Highly porous ultra low-k dielectric materials meeting these criteria include, but are not limited to, various types of organosilicate glass (also referred to less formally as "carbon doped oxide"). After deposition of ILD 30, a chemical mechanical planarization (CMP) process can be performed to planarize the upper surface of ILD 30.

Next, as illustrated in FIG. 3, a photoresist 32 is deposited over ILD 30 and patterned for utilization as an etch mask. With reference to FIG. 4, an etching process is then performed to create contact openings 34 and 36 in ILD 30 and expose contact points 26 and 28, respectively. In one embodiment, contact openings 34 and 36 are formed utilizing a reactive ion etching (RIE) process in conjunction with a chemistry selective to the material from which ILD 30 is formed. For example, in embodiments wherein ILD 30 is an organosilicate glass, a chlorofluorocarbon chemistry, such as carbon hydro-trifluoride or a tetrafluoromethane chemistry, can be employed during etching. After etching, photoresist 32 is removed utilizing, for example, a conventional ashing process.

Figure 5:
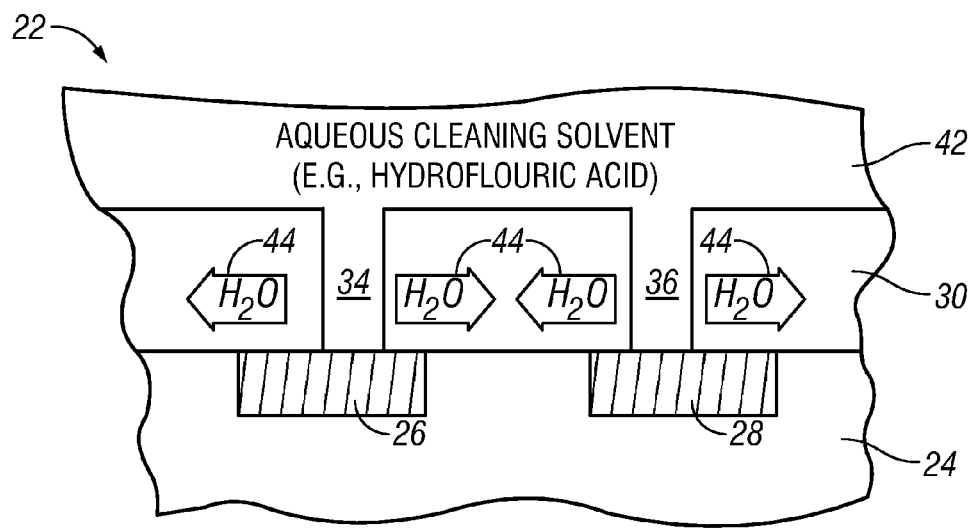

The etching process performed during STEP 20 (FIG. 1) and utilized to create contact openings 34 and 36 through ILD 30 leaves behind etch residual, which may adhere to the inner sidewalls of contact openings 34 and 36 as illustrated in FIG. 4 at 38 (the etch residue is exaggerated in FIG. 4 for clarity). The amount of etch residue within contact openings 34 and 36 tends to increase when an aggressive etch chemistry is utilized during etching (STEP 20, FIG. 1), as is often the case when ILD 30 is formed from an ultra low-k dielectric of the type described above. Thus, to remove etch residue from the inner sidewalls of contact openings 34 and 36, semiconductor device 22 is next subjected to a wet clean process at STEP 40 of the exemplary semiconductor fabrication method illustrated in FIG. 1. During the wet clean process (STEP 40, FIG. 1), semiconductor device 22 is flooded with an aqueous cleaning solvent 42 (illustrated generically in FIG. 5). Aqueous cleaning solvent 42 flows into contact openings 34 and 36 to dissolve and effectively wash away etch residue adhering to the inner sidewalls of contact openings 34 and 36. As indicated in FIG. 5, aqueous cleaning solvent 42 can assume the form of hydrofluoric acid diluted in water; however, various other cleaning solvents can be utilized during STEP 40 to dissolve and wash away the etch residue from within contact openings 34 and 36 including, for example, acetic acid and deionized water.

Aqueous cleaning solvent 42, which is applied to semiconductor device 22 during the wet clean process performed during STEP 40 (FIG. 1), effectively removes etch residue from within contacts openings 34 and 36. However, due to the porosity of ILD 30, and particularly due to the porosity of the inner sidewalls of contact openings 34 and 36, water from aqueous cleaning solvent 42 is absorbed into ILD 30. This may be more fully appreciated by again referring to FIG. 5, which generically illustrates the bulk flow of water from aqueous cleaning solvent 42, through the porous sidewalls of contacts openings 34 and 36, and into the body of ILD 30 (represented in FIG. 5 by arrows 44). As the water diffuses into ILD 30, the water may also carry other contaminants (e.g., debris from the ashing of photoresist 32) deep into ILD 30. Absorption of water into ILD 30 is especially severe when ILD 30 is formed from a highly porous ultra low-k dielectric material of the type described above. If not removed, the residual water can oxidize liner metals subsequently deposited into contact openings 34 and 36, which can result in an undesirable reduction in the effectiveness of the liner metals as a copper barrier and/or an undesirable increase line-to-line capacitance of finished semiconductor device 22. Although water from aqueous cleaning solvent 42 generally diffuses into ILD 30 via bulk flow, the residual water typically can not be removed from ILD 30 via bulk flow due to the small pore size of the ILD 30 (e.g., as noted above, ILD 30 may be deposited to have an average pore diameter less than approximately 5 nm). Therefore, to remove residual water and other contaminants (e.g., debris from the ashing of photoresist 32, other liquid contaminants resulting from exposure to optical planarizing layer solvents, etc.) from within ILD 30, semiconductor device 22 is subjected azeotropic drying process wherein the residual water is vaporized along with an azeotropic-forming chemical as described more fully below in conjunction with FIGS. 6-8.

Figure 6:
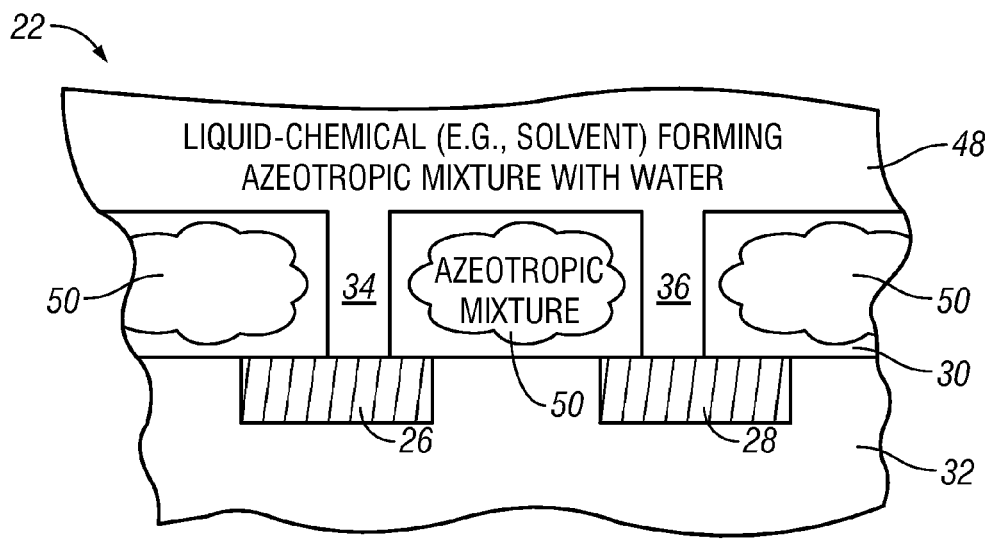

Advancing to STEP 46 of the exemplary semiconductor fabrication process illustrated in FIG. 1, semiconductor device 22 is next exposed to a liquid chemical that forms an azeotropic mixture with water. More specifically, and as illustrated in FIG. 6 at 48, contact openings 34 and 36 are flooded with the azeotrope-forming liquid chemical, which is absorbed through the porous inner sidewalls of contact openings 34 and 36 and diffuses into the body of ILD 30. Within ILD 30, the liquid chemical mixes with water to form an azeotropic mixture as illustrated generically in FIG. 6 at 50. As utilized herein, the terms "azeotropic mixture" and "azeotrope" are utilized to denote a mixture of at least two chemicals constituents wherein the ratio of the chemical constituents remains substantially constant as the azeotropic mixture changes phase from a liquid to a vapor state. The azeotrope-forming liquid chemical applied to semiconductor device 22 during STEP 46 (FIG. 1) is preferably a solvent that is commonly available, relatively inexpensive, and environmentally safe. A non-exhaustive list of chemicals that form azeotropic mixture with water that may be applied to semiconductor device 22 during STEP 46 (FIG. 1) includes ethanol, isopropanol, acetonitrile, ethyl acetate, methyl acetate, methyl ethyl ketone, tetrahydrofuran, dichloromethane, n-butanol, cyclohexanol, and benzyl alcohol. A preferred subset of the foregoing list of azeotrope-forming chemical includes ethanol, isopropanol, n-butanol, and cyclohexanol.

Figure 7:
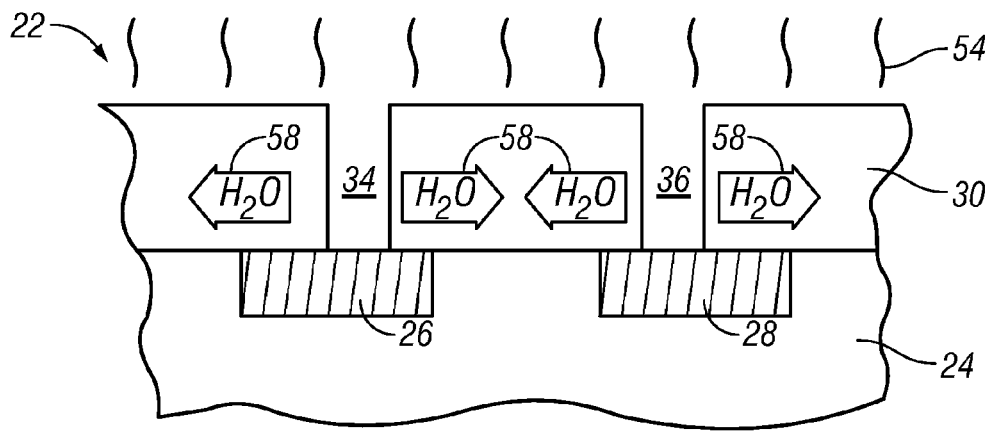
Figure 8:
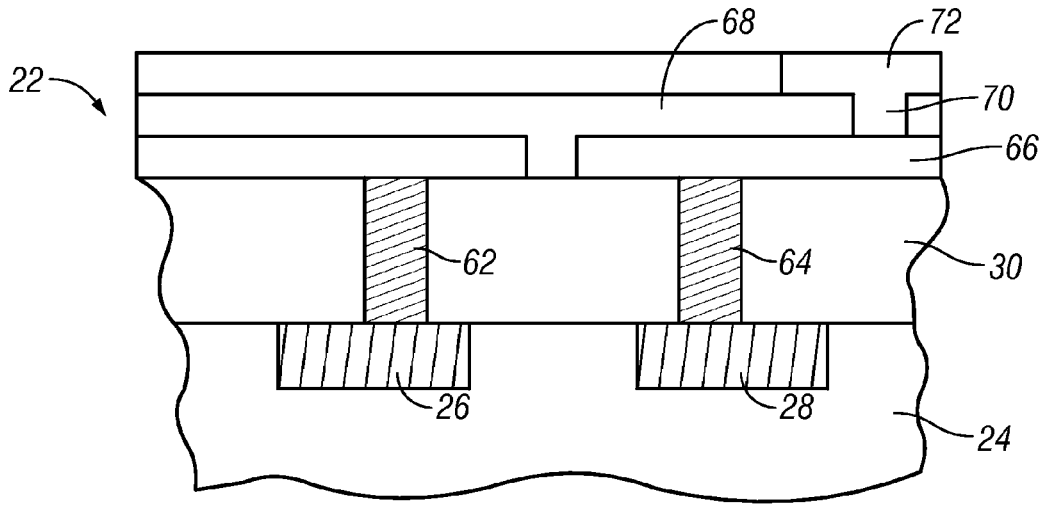

Next, and as illustrated generically in FIG. 7 at 54, vaporization of the liquid chemical/water azeotropic mixture is induced (STEP 56, FIG. 1). Vaporization of the azeotropic mixture can be induced by, for example, spin drying. Additionally or alternatively, vaporization of the azeotropic mixture can be induced by exposing semiconductor device 22 to elevated temperatures for a predetermined time period and/or by placing semiconductor device 22 under partial vacuum. Notably, as represented in FIG. 7 by arrows 58, the residual water evaporates from within ILD 30 during STEP 56 (FIG. 1) along with the azeotrope-forming liquid chemical previously flooded onto semiconductor device 22 during STEP 46 (FIG. 1). By inducing evaporating of the azeotropic mixture, a substantial portion, and perhaps the entire volume, of the residual water contained within ILD 30 is removed. As the residual water is vaporized during STEP 56 (FIG. 1), the residual water can be effectively removed from deep within ILD 30 even when ILD 30 is formed from an ultra low-k material having relatively small pores (e.g., having an average pore diameter less than approximately 5 nm). As a further advantage, other contaminants (e.g., debris from the ashing of photoresist 32, liquid contaminants from optical planarizing layer solvents) may also be removed from ILD 30 during STEP 56 (FIG. 1) along with the residual water contained therein.

To conclude the exemplary process illustrated in FIG. 1, additional processing steps are performed to complete the fabrication of semiconductor device 22 (STEP 60, FIG. 1). For example, as illustrated in FIG. 7, electrically conductive plugs 62 and 64 are formed within contact openings 34 and 36. Plugs 62 and 64 can be formed by depositing sequential layers of a contact material, such as titanium; a liner metal, such as titanium nitride or tantalum nitride; and a conductive plug material, such as tungsten or copper. A layer of metal silicide (not illustrated), such as cobalt silicide or nickel silicide, may also be formed in the contact opening before the formation of conductive plugs 62 and 64. Any excess material resulting from plug formation can be removed utilizing a CMP process. Notably, due to the performance of the azeotropic drying process described above, little to no residual water remains within ILD 30 to oxide the liner metal deposited during STEP 60 (FIG. 1). Successive interconnect layers are then created by depositing and patterning a first metal layer (e.g., metal layer 66 shown in FIG. 8), forming a overlying dielectric layer (e.g., dielectric layer 68 shown in FIG. 8), creating vias through the overlying dielectric layer (e.g., via 70 shown in FIG. 8), depositing and patterning a second metal layer (e.g., metal layer 72 shown in FIG. 8), and so on. Various additional processing steps are also performed during STEP 60 (FIG. 1) to complete fabrication of semiconductor device 22; however, such processing steps are conventionally known in the industry and are not described herein in the interests of concision.

In view of the above, there has been provide an exemplary embodiment of a method for fabricating a semiconductor device including an azeotropic drying process suitable for removing residual water and other contaminants from within a highly porous materials, such as an inter layer dielectric formed from a porous ultra low-k material, without prolonged high temperature exposure of the semiconductor device. Advantageously, the above-described exemplary semiconductor fabrication method includes an azeotropic drying technique that can be readily incorporated into conventional wet cleaning processes utilized to remove etch residue and other contaminants from the inner sidewalls of features (e.g., contact openings) formed in an inter layer dielectric. While utilized to remove residual water from within a highly porous inter layer dielectric in the above-described example, embodiments of the method can also be utilized to remove residual water and other contaminants from other materials utilized in the fabrication of semiconductor devices, whether or not such materials have a porosity exceeding approximately 10%.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:
1. A method for fabricating a semiconductor device, comprising the steps of:
   providing a partially-completed semiconductor device including a first feature formed in a porous material;
   wet cleaning the partially-completed semiconductor device with an aqueous cleaning solvent, wherein a quantity of the aqueous cleaning solvent diffuses into a body portion of the porous material;
   removing the aqueous cleaning solvent from the partially-completed semiconductor device, wherein residual water remains in the body portion of the porous material;
   exposing the partially-completed semiconductor device to a liquid chemical that is substantially depleted of water such that the liquid chemical diffuses into the body portion of the porous material and mixes with the residual water to form an azeotropic mixture in the body portion of the porous material; and inducing evaporation of the azeotropic mixture to remove the residual water from the body portion of the porous material, wherein the step of inducing comprises placing the partially-completed semiconductor device under partial vacuum.

2. A method according to claim 1 wherein the step of providing comprises providing a partially-completed semiconductor device including a first feature formed in a highly porous material having a porosity exceeding approximately 10%.

3. A method according to claim 2 wherein the step of providing comprises the steps of:
providing a semiconductor substrate;
forming a highly porous inter layer dielectric (ILD) overlying the substrate; and
etching a contact opening in the highly porous ILD.

4. A method according to claim 3 wherein the step of forming comprises depositing a highly porous ultra low-k material over the semiconductor substrate to form the highly porous ILD, the highly porous ultra low-k material having a dielectric constant less than about 2.5.

5. A method according to claim 4 wherein the step of exposing comprises flooding the contact opening with the liquid chemical that forms the azeotropic mixture with the residual water.

6. A method according to claim 5 wherein the liquid chemical is selected from the group consisting of ethanol, isopropanol, acetonitrile, ethyl acetate, methyl acetate, methyl ethyl ketone, tetrahydrofuran, dichloromethane, n-butanol, cyclohexanol, and benzyl alcohol.

7. A method according to claim 6 wherein the liquid chemical is selected from the group consisting of ethanol, isopropanol, n-butanol, and cyclohexanol.

8. A method according to claim 4 wherein the highly porous ultra low-k material comprises an organosilicate glass.

9. A method according to claim 4 wherein the step of depositing comprises depositing a highly porous ultra low-k material over the semiconductor substrate to form a highly porous ILD having a porosity between approximately 10% and approximately 50%.

10. A method according to claim 9 wherein the step of depositing comprises depositing a highly porous ultra low-k material over the semiconductor substrate to form a highly porous ILD having a porosity between approximately 20% and approximately 30%.

11. A method according to claim 9 wherein the step of depositing comprises depositing a highly porous ultra low-k material over the semiconductor substrate to form a highly porous ILD having an average pore diameter less than approximately 5 nm.

12. A method according to claim 1 wherein the step of inducing evaporation comprises spin drying the semiconductor device while placed under partial vacuum to induce evaporation of the azeotropic mixture.

13. A method for fabricating a semiconductor device, comprising the steps of:
providing a semiconductor substrate;
forming a highly porous inter layer dielectric (ILD) overlying the substrate;
etching a contact opening in the highly porous ILD;
wet cleaning the semiconductor device with an aqueous cleaning solvent, wherein a quantity of the aqueous cleaning solvent diffuses into a body portion of the highly porous ILD;
removing the aqueous cleaning solvent from the semiconductor device, wherein residual water remains in the body portion of the highly porous ILD;
flooding the contact opening with a liquid consisting of a chemical that is substantially depleted of water and that mixes with the residual water to form an azeotropic mixture, wherein the chemical is selected from the group consisting of ethanol, n-butanol, and cyclohexanol; and
inducing evaporation of the azeotropic mixture to remove the residual water from the body portion of the highly porous ILD.

14. A method according to claim 13 wherein the step of forming comprises depositing an ultra low-k material over the semiconductor substrate having a porosity between approximately 10% and approximately 50% and having a dielectric constant less than about 2.5.

15. A method according to claim 14 wherein the step of depositing comprises depositing an ultra low-k material to have a have a porosity between approximately 20% and approximately 30%.

16. A method according to claim 15 wherein the step of depositing comprises depositing an ultra low-k material to have an average pore diameter less than approximately 5 nm.

17. A method according to claim 14 wherein the ultra low-k material comprises an organosilicate glass.

18. A method for fabricating a semiconductor device, comprising the steps of:
providing a semiconductor substrate;
depositing an organosilicate glass over the semiconductor substrate to form a highly porous inter layer dielectric (ILD) having a porosity between approximately 10% and approximately 50%;
etching a contact opening in the highly porous ILD;
wet cleaning the semiconductor device with an aqueous cleaning solvent to remove etch residue from the inner sidewalls of the contact opening, wherein a quantity of the aqueous cleaning solvent diffuses into a body portion of the highly porous ILD;
removing the aqueous cleaning solvent from the semiconductor device, wherein residual water remains in the body portion of the highly porous ILD;
flooding the contact opening with a liquid chemical consisting of ethanol that is substantially depleted of water and that mixes with the residual water to form forms an azeotropic mixture; and
inducing evaporation of the azeotropic mixture to remove the residual water from the body portion of the highly porous ILD.

19. A method according to claim 18 wherein the step of depositing comprises depositing the organosilicate glass over the semiconductor substrate to form the highly porous ILD having the porosity between approximately 20% and approximately 30% and an average pore diameter less than approximately 5 nm.

* * * * *